United States Patent
Chen et al.

(10) Patent No.: US 12,513,888 B2
(45) Date of Patent: Dec. 30, 2025

(54) MEMORY DEVICE AND MANUFACTURING METHOD THEREOF

(71) Applicant: Fujian Jinhua Integrated Circuit Co., Ltd., Quanzhou (CN)

(72) Inventors: Xuanxuan Chen, Quanzhou (CN); Mingqin Shangguan, Quanzhou (CN); Changfu Ye, Quanzhou (CN); Tsuo-Wen Lu, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 596 days.

(21) Appl. No.: 17/943,146

(22) Filed: Sep. 12, 2022

(65) Prior Publication Data
US 2024/0032273 A1    Jan. 25, 2024

(30) Foreign Application Priority Data

Jul. 22, 2022 (CN) .................. 202210866481.9
Jul. 22, 2022 (CN) .................. 202221913780.5

(51) Int. Cl.
*H10B 12/00* (2023.01)
*G11C 5/06* (2006.01)

(52) U.S. Cl.
CPC .......... *H10B 12/312* (2023.02); *G11C 5/063* (2013.01); *H10B 12/0335* (2023.02); *H10B 12/488* (2023.02)

(58) Field of Classification Search
CPC .............. H10B 12/312; H10B 12/0335; H10B 12/488; H10B 12/053; H10B 12/34; G11C 5/063; H10D 30/6755; H10D 30/6757
See application file for complete search history.

(56) References Cited

U.S. PATENT DOCUMENTS

| | | | |
|---|---|---|---|
| 9,054,037 B2 | 6/2015 | Kim | |
| 9,111,991 B2 | 8/2015 | Lee | |
| 9,825,142 B2 | 11/2017 | Seo | |
| 10,211,091 B2 | 2/2019 | Lee | |
| 11,062,751 B2 | 7/2021 | Cho | |
| 11,282,833 B2 | 3/2022 | Lee | |
| 2016/0343714 A1 | 11/2016 | Cho | |
| 2020/0161305 A1 | 5/2020 | Nam | |

(Continued)

FOREIGN PATENT DOCUMENTS

TW    I762173 B  *  4/2022

*Primary Examiner* — Ali Naraghi
*Assistant Examiner* — Samuel Jonathan Smith
(74) *Attorney, Agent, or Firm* — Winston Hsu

(57) ABSTRACT

A memory device and a manufacturing method thereof are disclosed in the present invention. The memory device includes a substrate, trenches, an oxide semiconductor layer, a gate dielectric layer, and word line structures. The substrate includes active regions and an isolation structure located between the active regions. The active regions contain silicon. The trenches are disposed in the active regions and the isolation structure. The oxide semiconductor layer is disposed in each trench. The gate dielectric layer is disposed on the oxide semiconductor layer and located in each trench. The word line structures are disposed on the gate dielectric layer and located in the trenches, respectively. At least a portion of the gate dielectric layer is disposed between the oxide semiconductor layer and each word line structure.

18 Claims, 6 Drawing Sheets

(56) References Cited

U.S. PATENT DOCUMENTS

2020/0212060 A1     7/2020  Yoo
2021/0375937 A1    12/2021  Wu
2022/0246185 A1*    8/2022  Yakubo ................ H10B 12/312

\* cited by examiner

MEMORY DEVICE AND MANUFACTURING METHOD THEREOF

BACKGROUND OF THE INVENTION

1. Field of the Invention

The present invention relates to a memory device and a manufacturing method thereof, and more particularly, to a memory device including an oxide semiconductor layer and a manufacturing method thereof.

2. Description of the Prior Art

Dynamic random access memory (DRAM) is a kind of volatile memory, which includes an array area composed of memory cells and a peripheral area composed of controlling circuits. Each of the memory cells is composed of a transistor and a capacitor connected with the transistor. Electric charge in the capacitor is controlled by the transistor for being released or stored so as to store information. The controlling circuit controls access to data of each memory cell via word lines (WL) and bit lines (BL) that span the array area and are electrically connected to each memory cell, which can be addressed to each memory cell.

For reducing the size of memory cells and manufacturing chips with higher integrity, the structure of memory cells has been developed towards three-dimensional, such as the use of buried word lines and stacked capacitors. However, under this circumstance, how to improve the operation performance of the device through new designs in terms of structure and/or manufacturing process has always been the goal of continuous efforts in the related fields.

SUMMARY OF THE INVENTION

A memory device and a manufacturing method thereof are provided in the present invention. An oxide semiconductor layer is disposed in trenches for improving operation performance of the memory device.

According to an embodiment of the present invention, a memory device is provided. The memory device includes a substrate, trenches, an oxide semiconductor layer, a gate dielectric layer, and word line structures. The substrate includes active regions and an isolation structure. The isolation structure is located between the active regions, and the active regions contain silicon. The trenches are disposed in the active regions and the isolation structure. The oxide semiconductor layer is disposed in each of the trenches. The gate dielectric layer is disposed on the oxide semiconductor layer and located in each of the trenches. The word line structures are disposed on the gate dielectric layer and located in the trenches, respectively. At least a portion of the gate dielectric layer is disposed between the oxide semiconductor layer and each of the word line structures.

According to an embodiment of the present invention, a manufacturing method of a memory device is provided. The manufacturing method includes the following steps. A substrate is provided, and the substrate includes active regions and an isolation structure. The isolation structure is located between the active regions, and the active regions contain silicon. Trenches are formed in the active regions and the isolation structure. An oxide semiconductor layer is formed in each of the trenches. A gate dielectric layer is formed on the oxide semiconductor layer. The gate dielectric layer is located in each of the trenches. Word line structures are formed on the gate dielectric layer, and the word line structures are located in the trenches, respectively. At least a portion of the gate dielectric layer is disposed between the oxide semiconductor layer and each of the word line structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1, FIG. 2, FIG. 3, and FIG. 4 are schematic drawings illustrating a manufacturing method of a memory device according to an embodiment of the present invention, wherein FIG. 1 is a top view schematic drawing, FIG. 2 is a schematic drawing in a step subsequent to FIG. 1, FIG. 3 is a schematic drawing in a step subsequent to FIG. 2, and FIG. 4 is a schematic drawing in a step subsequent to FIG. 3.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
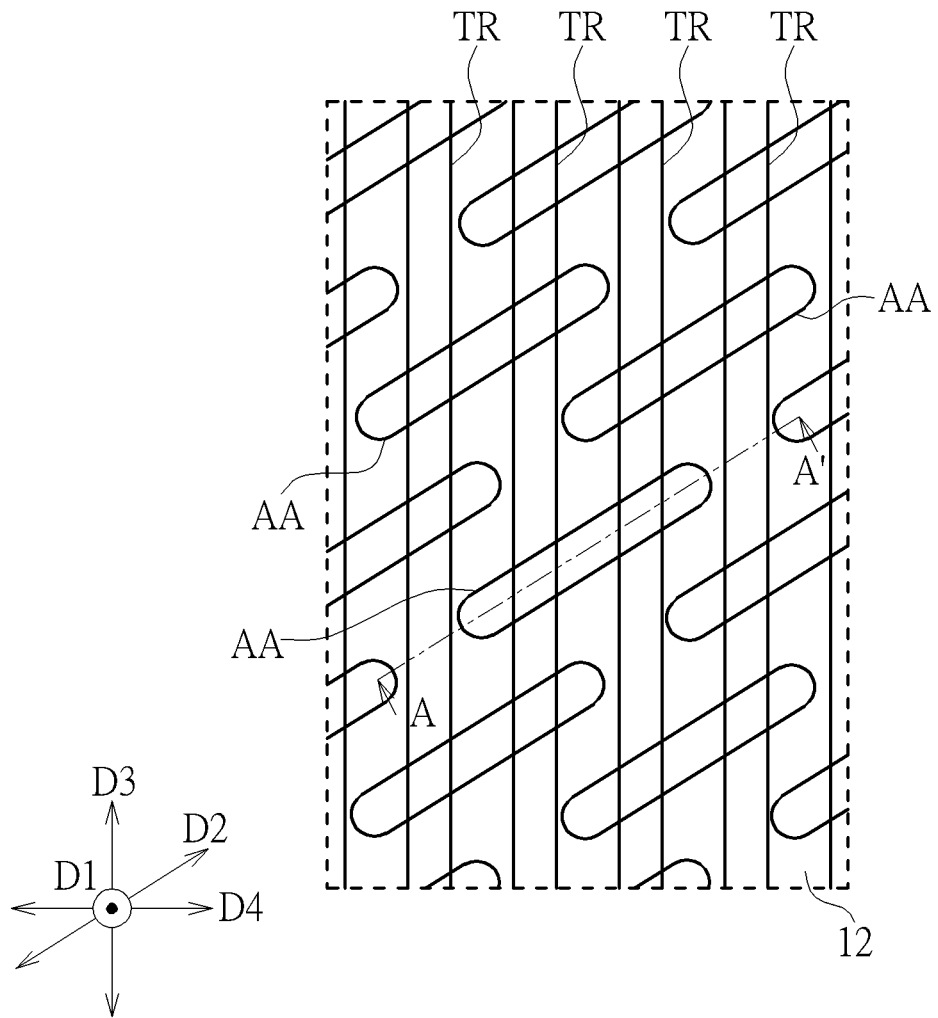
Figure 2:
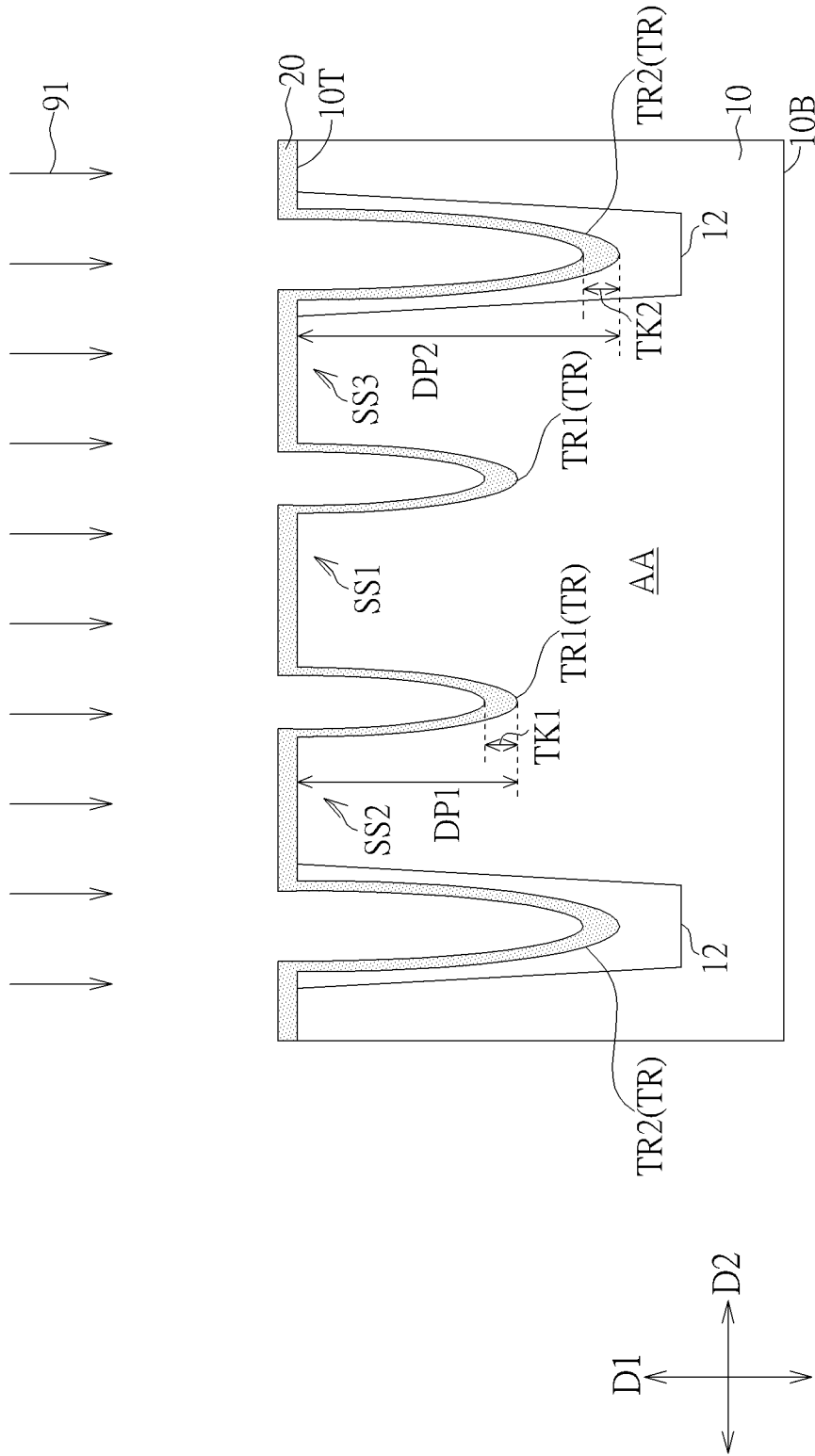
Figure 3:
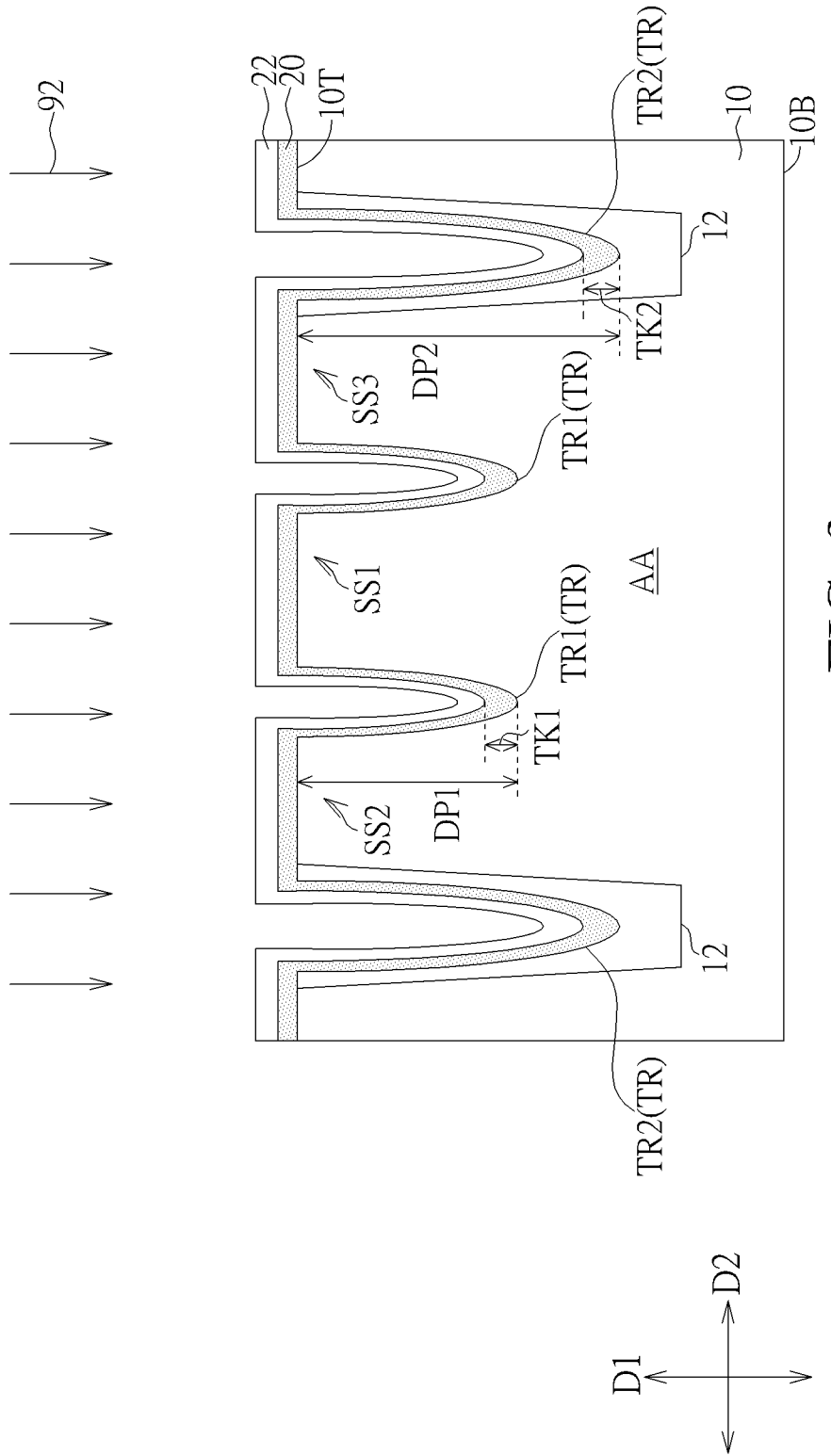
Figure 4:
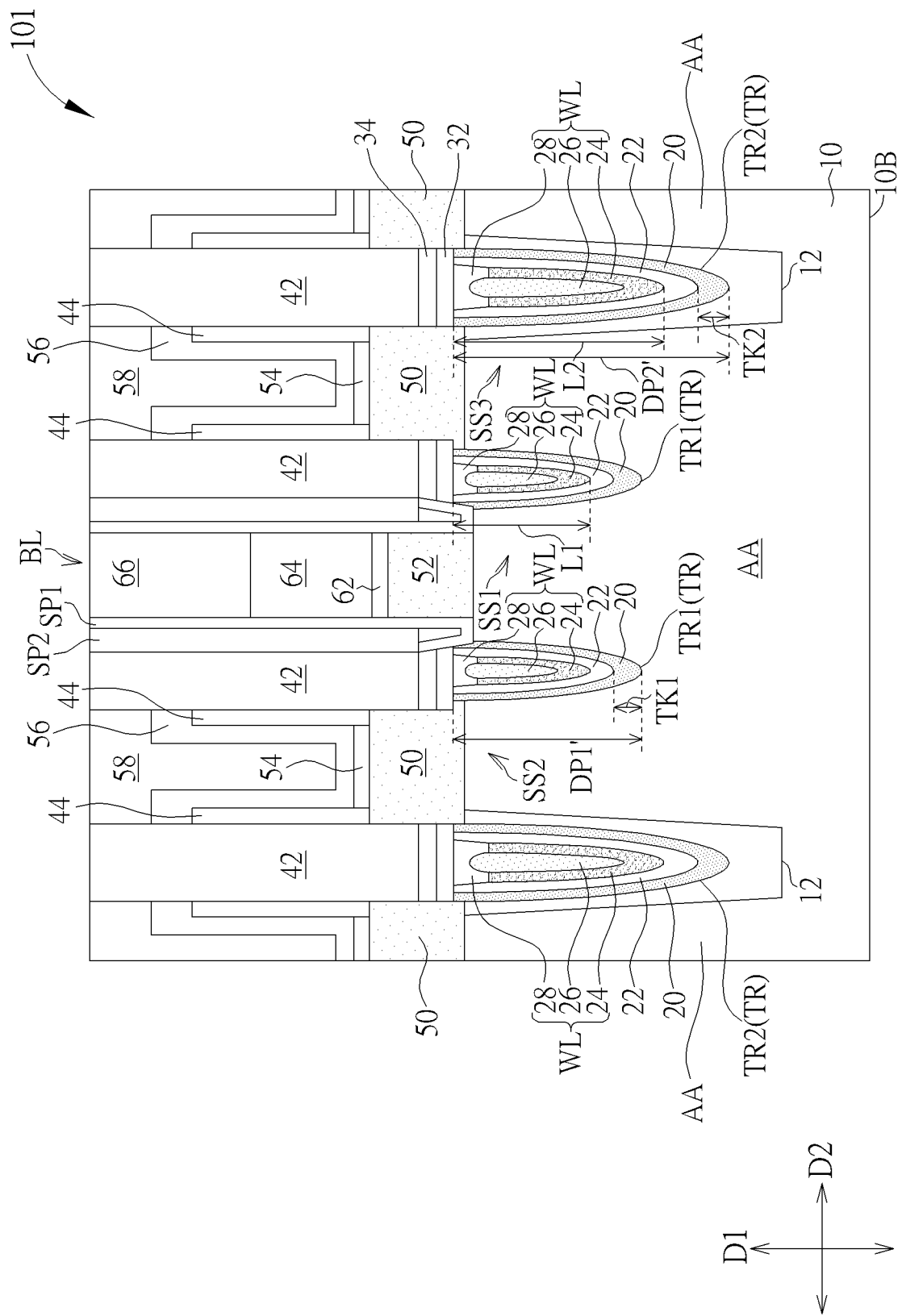

Please refer to FIG. 1, FIG. 2, FIG. 3, and FIG. 4. FIG. 1, FIG. 2, FIG. 3, and FIG. 4 are schematic drawings illustrating a manufacturing method of a memory device according to an embodiment of the present invention, wherein FIG. 1 is a top view schematic drawing, FIG. 2 is a schematic drawing in a step subsequent to FIG. 1, FIG. 3 is a schematic drawing in a step subsequent to FIG. 2, and FIG. 4 is a schematic drawing in a step subsequent to FIG. 3. In some embodiments, FIG. 2 may be regarded as a schematic drawing in a step subsequent to a cross-sectional diagram taken along a line A-A' in FIG. 1, but not limited thereto. The manufacturing method in this embodiment may include the following steps. As shown in FIG. 4, a substrate 10 is provided, and the substrate 10 includes active regions AA and an isolation structure 12. The isolation structure 12 is located between the active regions AA. Trenches TR are formed in the active regions AA and the isolation structure 12. An oxide semiconductor layer 20 is conformally formed in each of the trenches TR. A gate dielectric layer 22 is formed on the oxide semiconductor layer 20. The gate dielectric layer 22 is located in each of the trenches TR. Word line structures WL are formed on the gate dielectric layer 22, and the word line structures WL are located in the trenches TR, respectively. At least a portion of the gate dielectric layer 22 is disposed between the oxide semiconductor layer 20 and each of the word line structures WL.

Specifically, the manufacturing method in this embodiment may include but is not limited to the following steps. As shown in FIG. 1 and FIG. 2, in some embodiments, the substrate 10 may include a semiconductor substrate, such as a silicon substrate, an epitaxial silicon substrate, a silicon germanium substrate, a silicon carbide substrate, a silicon-on-insulator (SOI) substrate, or a substrate made of other suitable materials. Before the step of forming the trenches described above, the isolation structure 12 may be formed in the substrate 10, and the isolation structure 12 may be used to define the active regions AA separated from one another in the substrate 10. For example, when the substrate 10 is a substrate containing silicon, each of the active regions AA may contain silicon. When silicon is the main component in the substrate 10, silicon may also be the main component in each of the active regions AA. The isolation structure 12 may include a single layer or multiple layers of insulation materials, such as silicon nitride, silicon oxynitride, silicon carbonitride, or other suitable insulation materials. In some embodiments, the isolation structure 12 may be regarded as shallow trench isolation (STI), but not limited thereto. In addition, the trenches TR described above may be formed in the substrate 10 after the step of forming the isolation structure 12, and each of the trenches TR may be disposed crossing one or a plurality of the active regions AA. For example, each of the active regions AA may extend in a horizontal direction (such as a direction D2 illustrated in FIG. 1), each of the trenches TR may extend in another horizontal direction (such as a direction D3 illustrated in FIG. 1), and the direction D2 and the direction D3 may be substantially orthogonal to a vertical direction (such as a direction D1 illustrated in FIG. 1), but not limited thereto. In some embodiments, each of the active regions AA may be disposed crossing two of the trenches TR, and the two trenches TR may divide the active region AA into three sections (such as a section SS1, a section SS2, and a section SS3 illustrated in FIG. 2), but not limited thereto. In other words, a portion of the substrate 10 (such as the section SS1, the section SS2, and/or the section SS3 of the active region AA) may be disposed between two of the trenches TR located adjacent to each other and be sandwiched between the two adjacent trenches TR in the horizontal direction (such as the direction D2).

In some embodiments, the direction D1 described above may be regarded as a thickness direction of the substrate 10. The substrate 10 may have a top surface 10T and a bottom surface 10B opposite to the top surface 10T in the direction D1, and each of the trenches TR may extend from the top surface 10T of the substrate 10 towards the bottom surface 10B of the substrate 10 in the direction D1 without completely penetrating through the substrate 10. A horizontal direction substantially orthogonal to the direction D1 (such as the direction D2, the direction D3, or other directions orthogonal to the direction D1) may be substantially parallel with the top surface 10T and/or the bottom surface 10B of the substrate 10, but not limited thereto. In this description, a distance between the bottom surface 10B of the substrate 10 and a relatively higher location and/or a relatively higher part in the direction D1 may be greater than a distance between the bottom surface 10B of the substrate 10 and a relatively lower location and/or a relatively lower part in the direction D1. The bottom or a lower portion of each component may be closer to the bottom surface 10B of the substrate 10 in the direction D1 than the top or upper portion of this component. Another component disposed above a specific component may be regarded as being relatively far from the bottom surface 10B of the substrate 10 in the direction D1, and another component disposed under a specific component may be regarded as being relatively close to the bottom surface 10B of the substrate 10 in the direction D1.

In some embodiments, the trenches TR extending in the direction D3 may overlap a plurality of the active regions AA, and each of the trenches TR may include a first portion TR1 disposed in the active regions AA and a second portion TR2 disposed in the isolation structure 12. In addition, the trenches TR may be formed by performing an etching process to the substrate 10 and the isolation structure 12, and the depth of the trench TR located in the active region AA may be different from the depth of the trench TR located in the isolation structure 12 because of the influence of the etching rate difference between the material of the substrate 10 and the material of the isolation structure 12 in the etching process. For example, a depth DP1 of the first portion TR1 may be less than a depth DP2 of the second portion TR2, but not limited thereto. In addition, the above-mentioned depth of the trench TR may be regarded as a distance between the bottommost part of the trench TR and the top surface 10T of the substrate 10 in the direction D1.

As shown in FIG. 2, after the step of forming the trenches TR, the oxide semiconductor layer 20 may be formed by a first film forming process 91. The oxide semiconductor layer 20 may include an oxide semiconductor material, such as indium gallium zinc oxide (IGZO), indium tin oxide (ITO), indium tin gallium oxide (ITGO), indium zinc oxide (IZO), zinc oxide (ZnO), indium tin gallium zinc oxide (ITGZO), or other oxide with semiconductor properties, but not limited thereto.

The oxide semiconductor layer 20 may be formed conformally on a surface of each of the trenches TR, the top surface 10T of the substrate 10, and a top surface of the isolation structure 12. In other words, each of the trenches TR is not fully filled with the oxide semiconductor layer 20, and a thickness of the oxide semiconductor layer 20 in the direction D1 may be less than the depth of each of the trenches TR in the direction D1. For example, a thickness of the oxide semiconductor layer 20 in the direction D1 (such as a thickness TK1 of the oxide semiconductor layer 20 located in the first portion TR1 in the direction D1 and a thickness TK2 of the oxide semiconductor layer 20 located in the second portion TR2 in the direction D1, as illustrated in FIG. 2) may be less than the depth of each of the trenches TR in the direction D1 (such as the depth DP1 and the depth DP2 described above). In some embodiments, the first film forming process 91 may include an atomic layer deposition (ALD) process or other suitable film forming approaches for ensuring that the oxide semiconductor layer 20 may be formed conformally on the surface of each of the trenches TR and reducing voids formed between the oxide semiconductor layer 20 and the substrate 10. In addition, a portion of the oxide semiconductor layer 20 may be regarded as disposed in the isolation structure 12 because each of the trenches TR may include the first portion TR1 disposed in the active region AA and the second portion TR2 disposed in the isolation structure 12, and the oxide semiconductor layer 20 may be formed in the first portion TR1 and the second portion TR2 of the trench TR.

As shown in FIG. 2 and FIG. 3, after the step of forming the oxide semiconductor layer 20, the gate dielectric layer 22 may be formed by a second film forming process 92. The gate dielectric layer 22 may include high dielectric constant (high-k) dielectric materials or other suitable dielectric materials. The high-k dielectric material described above may include hafnium oxide ($HfO_X$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials. The gate dielectric layer 22 may be formed conformally on the oxide semiconductor layer 20. In other words, each of the trenches TR is not fully filled with the gate dielectric layer 22 also, and the thickness of the gate dielectric layer 22 may be less than the depth of each of the trenches TR. In some embodiments, the second film forming process 92 may include an atomic layer deposition process or other suitable film forming approaches for ensuring that the gate dielectric layer 22 may be formed conformally on the oxide semiconductor layer 20 located in each of the trenches TR. Additionally, in some embodiments, the first film forming process 91 and the second film forming process 92 may be performed successively in the same process chamber for process simplification and/or reducing the negative influence of the external environment. In some embodiments, the gate dielectric layer 22 with high dielectric constant and/or less equivalent oxide thickness (EOT) may be used to improve the leakage current of the corresponding semiconductor structure (such as a transistor structure), but not limited thereto.

Subsequently, as shown in FIG. 4, the word line structures WL may be formed in the substrate 10, and a storage node contact structure 50, a bit line contact structure 52, and a bit line structure BL may be formed on the substrate 10. Each of the word line structures WL may be formed in the corresponding trench TR, and the word line structure WL may be formed on the gate dielectric layer 22 located in the trench TR. In some embodiments, each of the word line structures WL may include a work function layer 24, an electrically conductive layer 26, and a capping layer 28, but not limited thereto. The work function layer 24 may include titanium nitride, titanium carbide, tantalum nitride, tantalum carbide, tungsten carbide, titanium trialuminide, aluminum titanium nitride, or other suitable electrically conductive work function materials. The electrically conductive layer 26 may include tungsten, aluminum, copper, titanium aluminide, titanium, or other suitable electrically conductive materials with relatively low electrical resistivity. The capping layer 28 may include silicon nitride, silicon oxynitride, silicon carbonitride, or other suitable insulation materials. In some embodiments, after the step of forming the word line structures WL, a suitable process (such as a chemical mechanical polishing process, but not limited thereto) may be performed for removing the oxide semiconductor layer 20 located outside the trenches TR, the gate dielectric layer 22 located outside the trenches TR, and/or other materials located outside the trenches TR, and the depth of each of the trenches TR after this process (such as a depth DP1' and a depth DP2' illustrated in FIG. 4) may be regarded as a distance between the bottommost portion of each of the trenches TR and a top surface of the word line structure WL (such as a top surface of the capping layer 28) in the direction D1, but not limited thereto.

The word line structure WL located in the trench TR may extend in the direction D1 and surrounded by the gate dielectric layer 22 and the oxide semiconductor layer 20. In some embodiments, the length of each of the word line structures WL in the direction D1 may be influenced by the depth of the trench TR. For example, a length L1 of the word line structure WL located in the first portion TR1 of the trench TR in the direction D1 may be less than a length L2 of the word line structure WL located in the second portion TR2 of the trench TR in the direction D1, but not limited thereto. In addition, the thickness of the oxide semiconductor layer 20 in the direction D1 (such as the thickness TK1 and the thickness TK2) may be less than the depth of each of the trenches TR in the direction D1 (such as the depth DP1' and the depth DP2'), and the thickness of the oxide semiconductor layer 20 in the direction D1 (such as the thickness TK1 and the thickness TK2) may be less than the length of each of the word line structures WL in the direction D1 (such as the length L1 and the length L2) for increasing the area where the oxide semiconductor layer 20 overlaps the word line structures WL and improving the operation performance of the corresponding transistor structure accordingly. Additionally, the depth of each of the trenches TR in the direction D1 may be greater than a width of each of the trenches TR in the horizontal direction (such as a width in the direction D2 and/or a width in a direction D4 illustrated in FIG. 4), and the area where the oxide semiconductor layer 20 overlaps the word line structures WL may be further increased by this design accompanied with the oxide semiconductor layer 20 formed conformally in the trenches TR.

In some embodiments, the section SS1, the section SS2, and the section SS3 described above may be regarded as three sections of each of the active regions AA divided by the word line structures WL formed straddling the active regions AA. The bit line structure BL may be formed on the section SS1, and two storage node contact structures 50 may be formed on the section SS2 and the section SS3, respectively, but not limited thereto. The storage node contact structure 50 may include silicon, such as amorphous silicon, polycrystalline silicon, other electrically conductive materials containing silicon, or other types of electrically conductive materials. In some embodiments, the bit line structure BL may include a barrier layer 62, an electrically conductive layer 64, and a capping layer 66, and the bit line structure BL may be electrically connected with the active region AA via the bit line contact structure 52. The bit line contact structure 52 may include electrically conductive metallic materials or electrically conductive non-metallic materials, such as polycrystalline silicon, amorphous silicon, or other electrically conductive non-metallic materials containing silicon. The barrier layer 62 may include titanium, titanium nitride, tungsten nitride, or other suitable electrically conductive barrier materials. The electrically conductive layer 64 may include aluminum, tungsten, copper, titanium aluminide, or other suitable electrically conductive metallic materials with low electrical resistivity. The capping layer 66 may include silicon nitride, silicon oxide, or other suitable insulation materials. In some embodiments, a mask layer 32, a mask layer 34, and a dielectric layer 42 may be disposed between the storage node contact structures 50 adjacent to each other and/or between the storage node contact structure 50 and the bit line structure BL; a spacer SP1 and a spacer SP2 may be disposed on a sidewall of the bit line structure BL; and a dielectric layer 44, a silicide layer 54, a barrier layer 56, and an electrically conductive layer 58 may be disposed on each of the storage node contact structures 50, but not limited thereto. The mask layer 32 and the mask layer 34 may include silicon nitride, silicon oxynitride, silicon carbonitride, or other suitable insulation materials. The dielectric layer 42 and the dielectric layer 44 may include nitride dielectric materials or other suitable dielectric materials. The silicide layer 54 may include electrically conductive metal silicide materials, and the barrier layer 56 may include titanium, titanium nitride, tungsten nitride, or other suitable electrically conductive barrier materials. The electrically conductive layer 58 may include aluminum, tungsten, copper, titanium aluminide, or other suitable electrically conductive materials with low electrical resistivity. The spacer SP1 and the spacer SP2 may include a single layer or multiple layers of insulation materials stacked with one another. In some embodiments, a capacitor structure (not illustrated) may be disposed above the electrically conductive layer 58, and the capacitor structure may be electrically connected with the storage node contact structure 50 via the electrically conductive layer 58 and the silicide layer 54, but not limited thereto.

In some embodiments, the storage node contact structure 50 may be directly connected with the substrate 10. In some embodiments, the storage node contact structure 50 may be directly connected with one of the active regions AA in the substrate 10 and directly connected with the oxide semiconductor layer 20, and a portion of the oxide semiconductor layer 20 may be sandwiched between the gate dielectric layer 22 and the storage node contact structure 50 in the horizontal direction, but not limited thereto. In some embodiments, each of the storage node contact structures 50 may only contact one of the oxide semiconductor layers 20 of the buried word line channel, such as only contacting one of the oxide semiconductor layers 20 located in the active region AA which the storage node contact structure 50 is disposed on. In some embodiments, a portion of the word line structure WL may be regarded as a gate of a transistor structure, the storage node contact structure 50 and the bit line contact structure 52 may be regarded as a source electrode and a drain electrode of this transistor structure, and a semiconductor channel region of this transistor structure may be formed with the oxide semiconductor layer 20 and/or a portion of the active region AA, but not limited thereto. The purposes of increasing the on-current (Ion) of the transistor structure, lowering the off-current (Ioff) of the transistor structure, reducing the write recovery time (tWR) of the memory device, enhancing the refresh frequency of the memory device, and/or improving the operational power consumption of the memory device may be achieved by forming the oxide semiconductor layer 20 conformally in the trenches TR and taking advantage of the material properties of the oxide semiconductor layer 20.

A memory device 101 illustrated in FIG. 4 may be formed by the manufacturing method described above. As shown in FIG. 4, the memory device 101 may include the substrate 10, the trenches TR, the oxide semiconductor layer 20, the gate dielectric layer 22, and the word line structures WL. The substrate 10 includes active regions AA and the isolation structure 12, and the isolation structure 12 is located between the active regions AA. The trenches TR are disposed in the active regions AA and the isolation structure 12. The oxide semiconductor layer 20 is conformally disposed in each of the trenches TR. The gate dielectric layer 22 is disposed on the oxide semiconductor layer 20 and located in each of the trenches TR. The word line structures WL are disposed on the gate dielectric layer 22 and located in the trenches TR, respectively. At least a portion of the gate dielectric layer 22 is disposed between the oxide semiconductor layer 20 and each of the word line structures WL.

Figure 5:
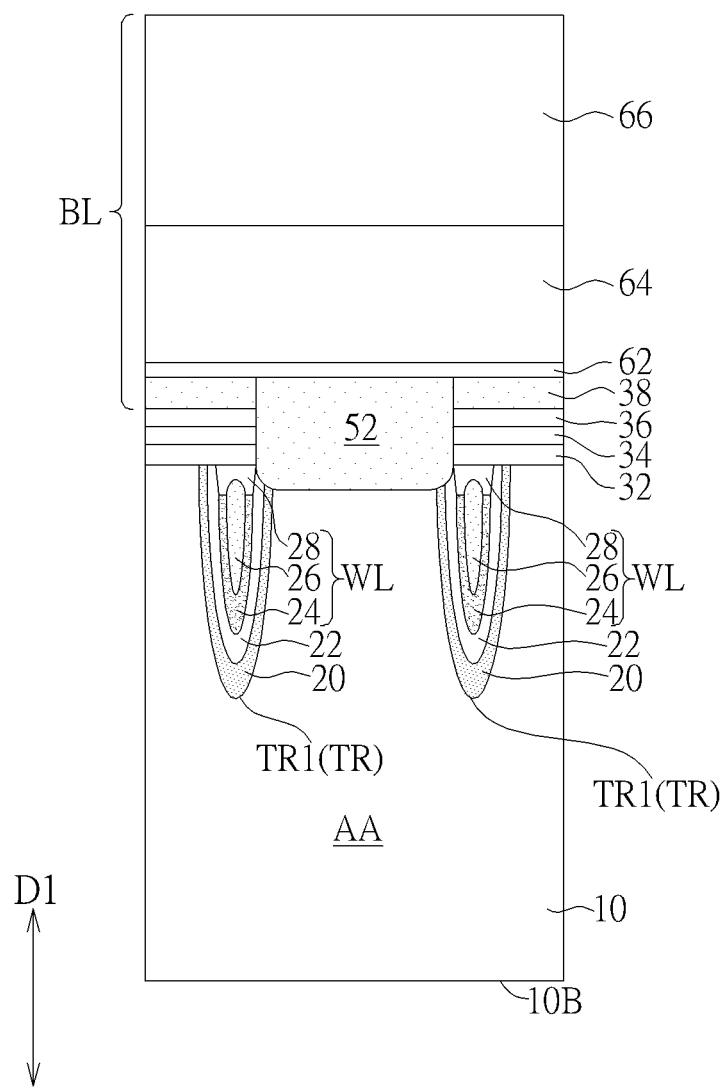
FIG. 5 is a cross-sectional schematic drawing illustrating a memory device according to an embodiment of the present invention.
Figure 6:
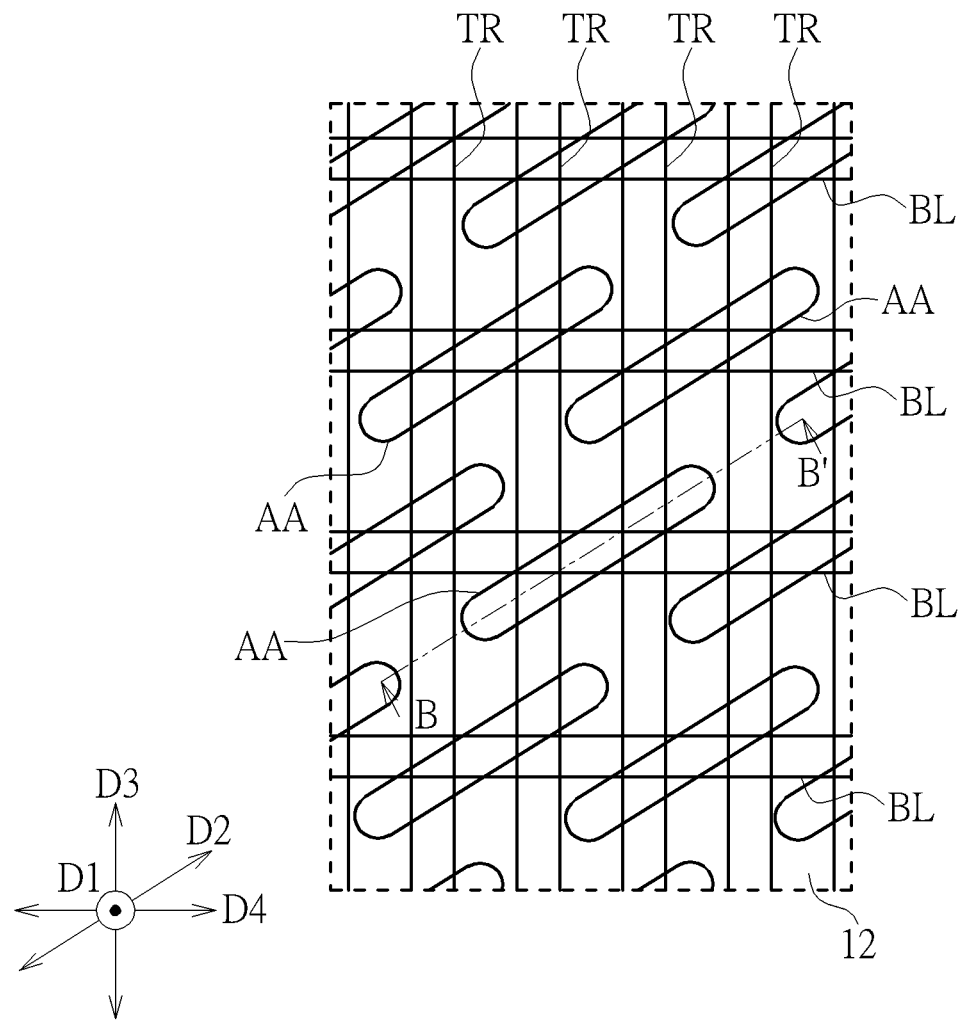
FIG. 6 is a top view schematic drawing illustrating a memory device according to an embodiment of the present invention.

Please refer to FIG. 4, FIG. 5, and FIG. 6. FIG. 5 is a cross-sectional schematic drawing illustrating a memory device according to an embodiment of the present invention, and FIG. 6 is a top view schematic drawing illustrating a memory device according to an embodiment of the present invention. FIG. 6 mainly shows the layout of the active regions AA, the trenches TR, the word line structures WL, and the bit line structures BL, FIG. 4 may be regarded as a cross-sectional diagram taken along a line B-B' in FIG. 6, and FIG. 5 may be regarded as a cross-sectional diagram taken along another horizontal direction, but not limited thereto. As shown in FIG. 4, FIG. 5, and FIG. 6, the memory device 101 may further include the storage node contact structures 50, the bit line contact structures 52, and the bit line structures BL. The bit line structures BL are disposed on the substrate 10 and electrically connected with the active regions AA via the bit line contact structures 52. Each of the word line structures WL may extend in the direction D3, and the word line structures WL may be disposed straddling the active regions AA and divide each of the active regions AA into three sections (such as the section SS1, the section SS2, and the section SS3 described above). Each of the bit line structures BL may extend in a horizontal direction (such as the direction D4) and be disposed straddling the active regions AA and the trenches TR. The storage node contact structure 50 is disposed on the substrate 10, and the storage node contact structure 50 is directly connected with the substrate 10. In some embodiments, the storage node contact structure 50 may be directly connected with the oxide semiconductor layer 20 and the active region AA in the substrate 10.

In some embodiments, the gate dielectric layer 22 may be disposed conformally on the oxide semiconductor layer 20, the word line structures WL located in the trenches TR may be surrounded by the gate dielectric layer 22 and the oxide semiconductor layer 20, and the oxide semiconductor layer 20, the gate dielectric layer 22, and the work function layer 24 may respectively include a U-shaped structure or a V-shaped structure in a cross-sectional diagram of the memory device 101, but not limited thereto. In some embodiments, the memory device 101 may further include a mask layer 36 disposed between the bit line structure BL and the mask layer 34, and the bit line structure BL may further include an electrically conductive layer 38 disposed between the mask layer 36 and the barrier layer 62. The electrically conductive layer 38 may include electrically conductive metallic materials or electrically conductive non-metallic materials, such as polycrystalline silicon, amorphous silicon, or other electrically conductive non-metallic materials containing silicon. The mask layer 36 may include silicon nitride, silicon oxynitride, silicon carbonitride, or other suitable insulation materials. In some embodiments, the bit line contact structure 52 may penetrate through the electrically conductive layer 38, the mask layer 36, the mask layer 34, and the mask layer 32 for being directly connected with the active region AA, the oxide semiconductor layer 20, and the gate dielectric layer 22, but not limited thereto.

To summarize the above descriptions, in the memory device and the manufacturing method thereof according to the present invention, the oxide semiconductor layer may be disposed in the trenches for improving the operation performance of the memory device. In addition, the oxide semiconductor layer may be formed conformally on the surfaces of the trenches and surrounding the word line structures for increasing the area where the oxide semiconductor layer overlaps the word line structures, and the operation performance of the memory device may be further enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a substrate, the substrate comprising:
active regions; and
an isolation structure located between the active regions, wherein the active regions contain silicon;
trenches disposed in the active regions and the isolation structure;
an oxide semiconductor layer disposed in each of the trenches;
a gate dielectric layer disposed on the oxide semiconductor layer and located in each of the trenches; and
word line structures disposed on the gate dielectric layer and located in the trenches, respectively, wherein at least a portion of the gate dielectric layer is disposed between the oxide semiconductor layer and each of the word line structures;
each of the word line structures comprises an electrically conductive layer, and a top portion of the oxide semiconductor layer and a top portion of the gate dielectric layer are higher than the electrically conductive layer in a vertical direction.

2. The memory device according to claim 1, wherein a thickness of the oxide semiconductor layer in the vertical direction is less than a depth of each of the trenches in the vertical direction.

3. The memory device according to claim 1, wherein a thickness of the oxide semiconductor layer in the vertical direction is less than a length of each of the word line structures in the vertical direction.

4. The memory device according to claim 1, wherein a portion of the substrate is disposed between two of the trenches located adjacent to each other.

5. The memory device according to claim 1, further comprising:
a storage node contact structure disposed on the substrate, wherein the storage node contact structure is directly connected with one of the active regions of the substrate.

6. The memory device according to claim 5, wherein the storage node contact structure is further directly connected with the oxide semiconductor layer.

7. The memory device according to claim 1, wherein the oxide semiconductor layer comprises a U-shaped structure in a cross-sectional diagram of the memory device.

8. The memory device according to claim 1, wherein the word line structures are disposed straddling the active regions and divide each of the active regions into three sections.

9. The memory device according to claim 1, wherein a portion of the oxide semiconductor layer is disposed in the isolation structure.

10. A manufacturing method of a memory device, comprising:
providing a substrate, the substrate comprising:
active regions; and
an isolation structure located between the active regions, wherein the active regions contain silicon;
forming trenches in the active regions and the isolation structure;
forming an oxide semiconductor layer in each of the trenches;
forming a gate dielectric layer on the oxide semiconductor layer, wherein the gate dielectric layer is located in each of the trenches; and
forming word line structures on the gate dielectric layer, wherein the word line structures are located in the trenches, respectively, and at least a portion of the gate dielectric layer is disposed between the oxide semiconductor layer and each of the word line structures;
wherein each of the word line structures comprises an electrically conductive layer, and a top portion of the oxide semiconductor layer and a top portion of the gate dielectric layer are higher than the electrically conductive layer in a vertical direction.

11. The manufacturing method of the memory device according to claim 10, wherein the oxide semiconductor layer is formed on a surface of each of the trenches by a first film forming process.

12. The manufacturing method of the memory device according to claim 11, wherein the first film forming process comprises an atomic layer deposition process.

13. The manufacturing method of the memory device according to claim 11, wherein the gate dielectric layer is formed on the oxide semiconductor layer by a second film forming process, wherein the first film forming process and the second film forming process are performed successively in the same process chamber.

14. The manufacturing method of the memory device according to claim 10, wherein a thickness of the oxide semiconductor layer in the vertical direction is less than a depth of each of the trenches in the vertical direction.

15. The manufacturing method of the memory device according to claim 10, wherein a thickness of the oxide semiconductor layer in the vertical direction is less than a length of each of the word line structures in the vertical direction.

16. The manufacturing method of the memory device according to claim 10, further comprising:
forming a storage node contact structure on the substrate, wherein the storage node contact structure is directly connected with one of the active regions of the substrate and the oxide semiconductor layer.

17. The memory device according to claim 1, further comprising:
a bit line contact structure disposed on the substrate, wherein the bit line contact structure directly contacts the oxide semiconductor layer and the gate dielectric layer.

18. The memory device according to claim 6, wherein a portion of the oxide semiconductor layer is disposed in the isolation structure, and the storage node contact structure is directly connected with the portion of the oxide semiconductor layer disposed in the isolation structure.

* * * * *